United States Patent [19]

Takahashi et al.

[11] Patent Number: 4,748,315
[45] Date of Patent: May 31, 1988

[54] MOLECULAR BEAM SOURCE

[75] Inventors: Kunihiro Takahashi; Kazumasa Fujioka, both of Ibaraki; Naoyuki Tamura, Kudamatsu, all of Japan

[73] Assignee: Hitachi, Ltd., Tokyo, Japan

[21] Appl. No.: 5,846

[22] Filed: Jan. 21, 1987

[30] Foreign Application Priority Data

Jan. 21, 1986 [JP] Japan .................................. 61-10516

[51] Int. Cl.⁴ ............................................ C23C 14/26
[52] U.S. Cl. ..................................... 219/275; 219/271; 219/426; 219/424; 118/726; 338/294; 373/118
[58] Field of Search ............... 219/271, 275, 272, 273, 219/274, 276, 390, 553, 426, 421, 424; 432/262, 263; 118/726, 727; 373/117, 118, 119, 134, 110, 111, 112, 132; 338/294

[56] References Cited

U.S. PATENT DOCUMENTS

| | | | |
|---|---|---|---|
| 1,975,410 | 10/1934 | Simpson | 338/294 |
| 2,650,254 | 8/1953 | Kremers | 373/134 |
| 2,835,781 | 5/1958 | Bashuk | 219/273 |
| 3,039,071 | 6/1962 | Ford | 338/294 |
| 3,281,517 | 10/1966 | Hemmer | 219/275 |
| 3,709,998 | 1/1973 | Anthony | 219/390 |
| 4,137,865 | 2/1979 | Cho | 118/49.1 |
| 4,410,796 | 10/1983 | Wilsey | 219/553 |
| 4,503,319 | 3/1985 | Moritoki | 219/553 |
| 4,553,022 | 11/1985 | Colombo | 219/275 |

FOREIGN PATENT DOCUMENTS 543207 3/1977 U.S.S.R. .............................. 219/553

Primary Examiner—E. A. Goldberg
Assistant Examiner—Teresa J. Walberg
Attorney, Agent, or Firm—Antonelli, Terry & Wands

[57] ABSTRACT

A molecular beam source suppresses a temperature fall at the opening of a crucible, to make a temperature distribution within the crucible uniform and to prevent the phenomenon of bumping of a source substance, whereby the quality of an evaporated film can be enhanced. The source includes a heater disposed around the crucible which is formed of straight parts and U-shaped end parts continuously repeated at equal intervals. The straight parts are arranged so as to extend in a vertical direction of the crucible and the U-shaped end parts are bent outwards at outer-peripheral positions of the opening of the crucible.

6 Claims, 2 Drawing Sheets

MOLECULAR BEAM SOURCE

BACKGROUND OF THE INVENTION

1. Field of the Invention

The present invention relates to a vaporization source for vacuum evaporation for use in a molecular beam epitaxy apparatus, etc.

2. Description of the Prior Art

As disclosed in U.S. Pat. No. 4,137,865, the fundamental structure of a vaporization source for vacuum evaporation has a construction wherein a crucible which contains a source substance being a molten metal is laterally supported by a prop, a heating source such as resistance heating means or radio-frequency induction heating means is disposed around the crucible, and radiant heat shield plates are arranged around and under the heating source and are surrounded with an outer wall.

In the vaporization source for vacuum evaporation thus constructed, the source substance heated by the heating source turns into the form of molecular beams, some of which directly fly out of the opening of the crucible being a jet port and the others of which adhere to the wall surface of the crucible and vaporize therefrom again. In such a case where the temperature of the wall surface of the crucible is lower than the vaporization point of the source substance, this source substance adheres and deposits to the crucible wall surface. When the source substance adhered to the wall surface drops, the bumping phenomenon in which the source substance flies out in the form of particles takes place. When the grains adhere to an evaporated thin film, they form the cause of defects in the film.

SUMMARY OF THE INVENTION

Object of the Invention

The present invention has been made in view of the problem of the prior art, and has for its object to provide a vaporization source for vacuum evaporation in which a conspicious temperature fall at the opening of a crucible is suppressed thereby attaining a uniform temperature distribution within the crucible so as to eliminate the phenomenon of bumping and to make the spurting amounts of molecular beams uniform, whereby the quality of an evaporated film can be enhanced.

DESCRIPTION OF THE PREFERRED EMBODIMENTS

The present invention will be described below with reference to some of the drawings (FIGS. 1–4 and FIGS. 7 and 8) illustrative of embodiments.

Figure 1:
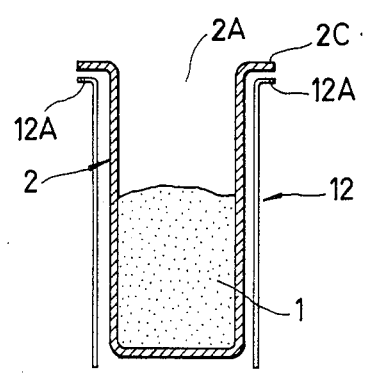
FIG. 1 is a vertical sectional view of the essential portions of the first embodiment of the present invention.
Figure 2:
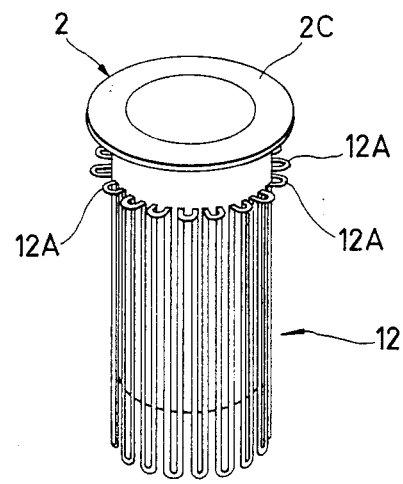
FIG. 2 is a perspective view of the first embodiment.

In a vaporization source for vacuum evaporation wherein a heater is disposed around a crucible 2 containing vaporization metal, a heater 12 (22, 32) is formed of straight parts and U-shaped end parts which are continuously repeated at equal intervals, the straight parts are arranged so as to extend in agreement with the vertical direction of the crucible, and the U-shaped upper-end parts 12A of the heater are bent radially outwards at the outer-peripheral positions of the opening 2A of the crucible (refer to FIGS. 1 and 2).

Figure 3:
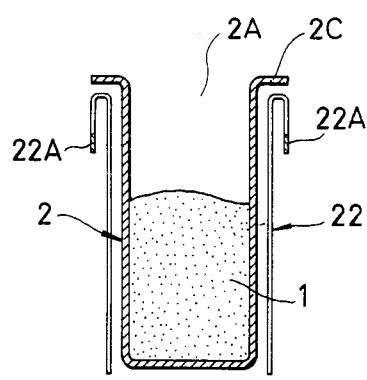
FIG. 3 is a vertical sectional view of the essential portions of the second embodiment of the present invention.
Figure 4:
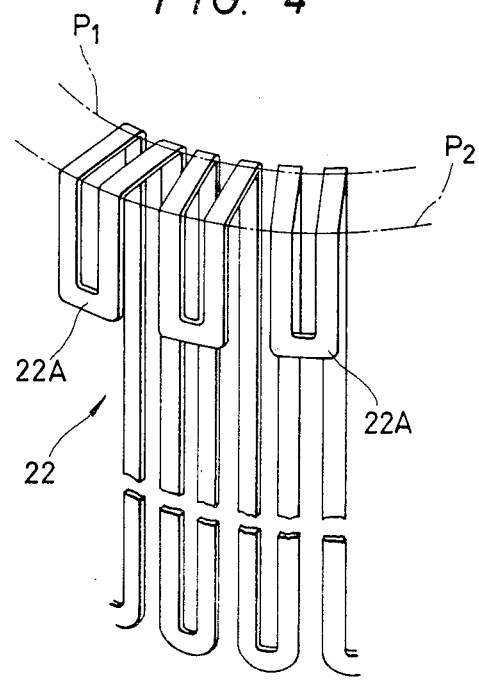
FIG. 4 is a partial enlarged view of the second embodiment.

In addition, the U-shaped parts of the heater bent radially outwards at the outer-peripheral positions of the crucible opening 2A can be folded back downwards so as to doubly surround the outer periphery of the crucible opening 2A with the bent parts of the heater (refer to FIGS. 3 and 4).

Figure 7:
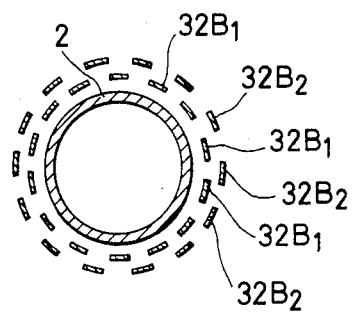
FIG. 7 is a sectional view taken along line VII—VII indicated in FIG. 6.
Figure 8:
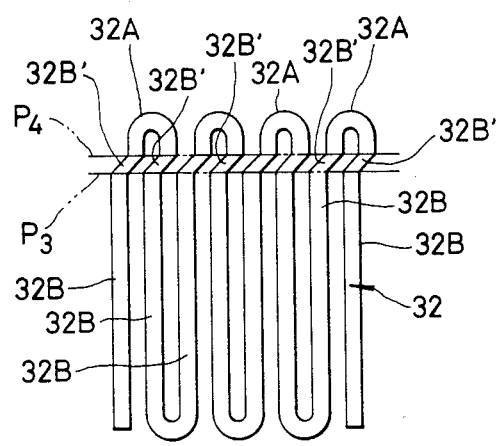
FIG. 8 is an expansion plan of a heater for use in the third embodiment.

Further, the double arrangement portion of the bent parts of the heater has a structure in which an inside heater $32B_1$ and an outside heater $32B_2$ do not overlap each other (refer to FIGS. 7 and 8).

Due to the above construction, the amount of heating by the heater at the outer periphery of the opening 2A of the crucible is larger than the amount of heating by the heater at the outer periphery of the bottom of the crucible, so that a temperature fall at the crucible opening 2A does not take place.

Now, the embodiments of the present invention will be more detailed with reference to the drawings.

FIGS. 1 and 2 show the first embodiment of the present invention.

Figure 5:
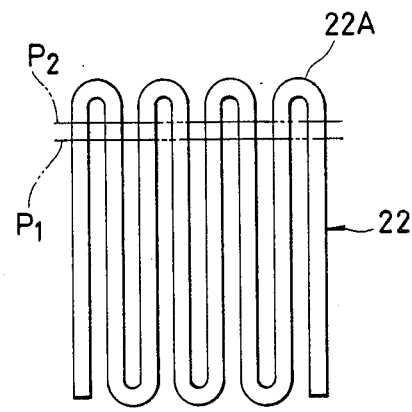
FIG. 5 is an expansion plan of a heater for use in the second embodiment.

Numeral 2 designates a crucible for containing a source substance 1 which is molten metal. A foil heater 12 which is formed of straight parts and U-shaped end parts continuously repeated at equal intervals as shown in FIG. 5 is arranged around the crucible 2 with the straight parts extending vertically. The U-shaped upper-end parts 12A of the foil heater 12 are bent radially outwards (in FIG. 5, perpendicularly to the sheet of paper), and they extend radiately along the lower surface of a flange 2C which is formed at the outer periphery of the opening 2A of the crucible 2. Since the other portions constituting the vaporization source for vacuum evaporation are the same as in the fundamental structure of the prior art, they shall be omitted from description.

It has already been explained concerning the prior art that the vicinity of the opening 2A of the crucible 2 is lower in temperature than the other part of the crucible 2. In this regard, it is common that the crucible 2 is provided with the flange 2C. Usually, however, a heater for especially heating this flange 2C has not hitherto been provided. Accordingly, the presence of the flange 2C in the crucible 2 has formed a factor for lowering the temperature near the crucible opening 2A still more. In contrast, according to the present embodiment, the heater 12 is bent at the upper end parts and is disposed along the flange 2C, so that the flange 2C can also be heated to suppress the temperature fall near the crucible opening 2A and to improve the distribution of temperatures within the crucible 2.

FIGS. 3, 4 and 5 show the second embodiment of the present invention.

Referring to these figures, a heater 22 employed for the second embodiment is formed similarly to the heater 12 of the first embodiment, and the U-shaped upper-end parts 22A thereof are bent outwards (perpendicularly to the sheet of paper in FIG. 5) at a position $P_1$ in FIG. 5 and are further bent downwards at a position $P_2$, into a structure in which the upper end parts of the heater 22 are folded back as shown in FIG. 4. Thus, the heater 22 is arranged so as to extend along the lower surface of the flange 2C and to doubly surround the outer circumference of the crucible opening 2A.

The present embodiment is more effective to suppress the temperature fall at the crucible opening 2A, than the first embodiment.

Figure 6:
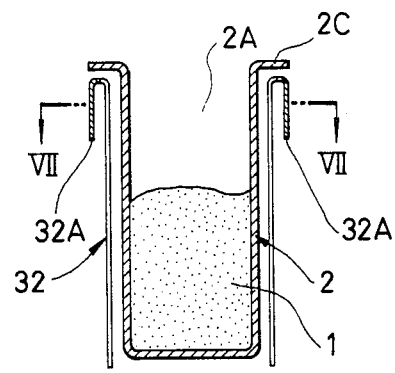
FIG. 6 is a vertical sectional view of the essential portions of the third embodiment of the present invention.

FIGS. 6, 7 and 8 show the third embodiment of the present invention.

A heater 32 employed for the third embodiment is a foil heater shaped similarly to the foil heater 22 used in the second embodiment, and the U-shaped upper parts 32A thereof are bent and folded back at positions $P_3$ and $P_4$ in FIG. 8, respectively (in FIG. 8, in parallel with the sheet of paper). Herein, the straight parts 32B of the heater 32 are crooked at the positions of the bent parts $P_3$ and $P_4$ (the crooks being indicated by symbols 32B'). That is, the heater is set off in the circumferential direction of the crucible (lateral direction in FIG. 8) at the folded-back parts, whereby the inside straight parts $32B_B$ and outside straight parts $32B_2$ of the heater do not overlap each other in the radial direction thereof as illustrated in a cross-sectional view of FIG. 7.

The third embodiment is still more effective to suppress the temperature fall at the crucible opening 2A, than the second embodiment. In particular, since the inside and outside heaters $32B_1$ and $32B_2$ hardly overlap radiately, enhancement in the efficiency of the heater can be expected. The temperature of the surface of the heater can accordingly be lowered to that extent, so the emission of gases harmful to the quality of a film, from the heater surface can be suppressed to enhance the film quality.

Figure 9:
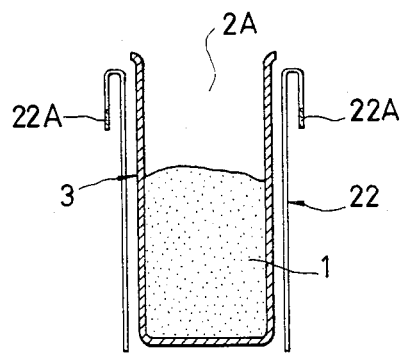
FIG. 9 is a sectional view of the fourth embodiment of the present invention.

FIG. 9 shows the fourth embodiment of the present invention. Whereas each of the first to third embodiments has concerned the crucible 2 having the flange 2C, the present embodiment is applied to a crucible 3 having no flange. The temperature fall at the crucible opening 2A can also be suppressed in such a way that any of the heaters 12, 22 and 32 used in the first to third embodiments described before is detachably arranged on the flangeless crucible 3.

Although the foil heater in the form of a sheet has been employed in any of the first to fourth embodiments, it may well be replaced with a wire heater. In addition, although the U-shaped upper-end parts 12A, 22A and 32A of the heaters are bent substantially orthogonally in the first to third embodiments, they may well be bent circularly.

What is claimed is:

1. In a vaporization source for vacuum evaporation wherein a heater is disposed around a crucible which contains vaporization metal, said heater being formed of straight parts and U-shaped end parts which are continuously repeated at equal intervals, said straight parts being arranged so as to extend in a vertical direction of said crucible, and the U-shaped end parts being bent outwards at outer-peripheral positions of an opening of said crucible.

2. A vaporization source for vacuum evaporation as defined in claim 1, wherein said U-shaped parts of said heater bent radially outwards at the outer-peripheral positions of the crucible opening are folded back downwards so as to doubly surround an outer periphery of said crucible opening with said heater.

3. A vaporization source for vacuum evaporation as defined in claim 2, wherein said straight parts of said heater form an inside heating section and portions of said U-shaped end parts of said heater which are folded back downwards form an outside heating section, said outside heating section having straight portions which are circumferentially set off from said straight parts of said inside heating section.

4. A vaporization source for vacuum evaporation as defined in claim 1, wherein said heater is a foil heater.

5. A vaporization source for vacuum evaporation as defined in claim 1, wherein said heater is a wire heater.

6. In a vaporization source for vacuum evaporation wherein a heater is disposed around a crucible which contains vaporization metal, said heater being formed of straight parts and U-shaped end parts which are continuously repeated at equal intervals, said straight parts being detachably arranged on said crucible so as to extend in a vertical direction of said crucible, and said heater being bent outwards at outer-peripheral positions of an opening of said crucible so as to suppress a temperature fall at the crucible opening.

* * * * *